US011909337B2

(12) United States Patent
Chiba et al.

(10) Patent No.: US 11,909,337 B2
(45) Date of Patent: Feb. 20, 2024

(54) DIELECTRIC ELASTOMER POWER GENERATION SYSTEM

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Makoto Takeshita, Tokyo (JP); Mitsugu Uejima, Tokyo (JP)

(73) Assignees: Selki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 390 days.

(21) Appl. No.: 17/264,845

(22) PCT Filed: Jul. 10, 2019

(86) PCT No.: PCT/JP2019/027307
§ 371 (c)(1),
(2) Date: Feb. 1, 2021

(87) PCT Pub. No.: WO2020/031600
PCT Pub. Date: Feb. 13, 2020

(65) Prior Publication Data
US 2021/0297013 A1    Sep. 23, 2021

(30) Foreign Application Priority Data
Aug. 9, 2018 (JP) ................................. 2018-150278

(51) Int. Cl.
*H02N 2/18* (2006.01)
*H01L 41/113* (2006.01)
*H10N 30/30* (2023.01)

(52) U.S. Cl.
CPC ............. *H02N 2/181* (2013.01); *H10N 30/30* (2023.02)

(58) Field of Classification Search
CPC ............... H01L 41/113; H01L 41/1132; H01L 41/1134; H01L 41/1136; H01L 41/1138;
(Continued)

(56) References Cited

U.S. PATENT DOCUMENTS

2011/0085284 A1* 4/2011 Micallef .................. H02N 2/18
310/319
2017/0155379 A1* 6/2017 Najafi .................... H02M 7/217

FOREIGN PATENT DOCUMENTS

JP    5479659 B2    4/2014
JP    5509350 B2    6/2014
(Continued)

OTHER PUBLICATIONS

Apr. 4, 2022, the Extended European Search Report issued by the European Patent Office in the corresponding European Patent Application No. 19846663.3.
(Continued)

*Primary Examiner* — Derek J Rosenau
(74) *Attorney, Agent, or Firm* — KENJA IP LAW PC

(57) ABSTRACT

A dielectric elastomer power generation system A1 includes a dielectric elastomer power generation element 3 having a dielectric elastomer layer 31 and a pair of electrode layers 32 sandwiching the dielectric elastomer layer 31. The dielectric elastomer power generation system A1 further includes a piezoelectric element 1 and a multi-stage voltage multiplier/rectifier circuit 2 that boosts and rectifies the voltage generated by the piezoelectric element 1 and applies the resulting voltage as an initial voltage to the dielectric elastomer power generation element 3. This configuration enables the system to be constructed at a lower cost and increase the amount of power generation.

2 Claims, 3 Drawing Sheets

(58) Field of Classification Search
CPC .... H10N 30/30; H10N 30/302; H10N 30/304;
                      H10N 30/306; H10N 30/308
USPC ......................................................... 310/339
See application file for complete search history.

(56) References Cited

FOREIGN PATENT DOCUMENTS

| | | |
|---|---|---|
| JP | 2014128161 A | 7/2014 |
| JP | 2015524239 A | 8/2015 |
| JP | 2015211601 A | 11/2015 |
| JP | 2016073366 A | 5/2016 |
| JP | 2018019490 A | 2/2018 |
| KR | 1020130042984 A | 4/2013 |
| WO | 2011105913 A1 | 9/2011 |

OTHER PUBLICATIONS

Aug. 13, 2019, International Search Report issued in the International Patent Application No. PCT/JP2019/027307.
Nov. 7, 2023, Official Decision of Refusal issued by the Japan Patent Office in the corresponding Japanese Patent Application No. 2020-536398.

* cited by examiner

DIELECTRIC ELASTOMER POWER GENERATION SYSTEM

TECHNICAL FIELD

The present invention relates to dielectric elastomer power generation systems.

BACKGROUND ART

A dielectric elastomer element includes a dielectric elastomer layer sandwiched between a pair of electrode layers, and various types have been developed for actuation and power generation purposes. Patent documents 1 and 2 disclose dielectric elastomer power generation systems in which dielectric elastomer elements are used for power generation. The dielectric elastomer power generation systems generate power by converting external force (mechanical energy), acting to stretch the dielectric elastomer element, into electric energy. The power generated is stored on secondary batteries, such as nickel metal hydride batteries, lithium-ion batteries and electric double-layer capacitors.

PRIOR ART DOCUMENTS

Patent Documents

Patent Document 1: JP-B-5479659
Patent Document 2: JP-B-5509350

SUMMARY OF THE INVENTION

Problem to be Solved by the Invention

The working principle of power generation by a dielectric elastomer element is to use the capacitance change of the dielectric elastomer element induced by external force to produce a higher voltage than the voltage of initially applied charges (hereinafter, initial voltage). For increasing the amount of power generated by the dielectric elastomer power generation system, it is desirable to apply a higher initial voltage to the dielectric elastomer element. However, applying such an initial voltage requires, for example, a dedicated power supply circuit, thereby leading to increase in the complexity and cost of the dielectric elastomer power generation system.

The present invention has been conceived under the circumstances described above and aims to provide a dielectric elastomer power generation system that can be constructed at a lower cost and yet is capable of generating an increased amount of power.

Means to Solve the Problem

The present invention provides a dielectric elastomer power generation system comprising a dielectric elastomer power generation element including a dielectric elastomer layer and a pair of electrodes sandwiching the dielectric elastomer layer. The dielectric elastomer power generation system further comprises a piezoelectric element and a multi-stage voltage multiplier rectifier circuit that boosts and rectifies a voltage generated by the piezoelectric element and applies a resulting voltage to the dielectric elastomer power generation element as initial charge.

According to a preferred embodiment of the present invention, the multi-stage voltage multiplier rectifier circuit comprises a Cockcroft-Walton circuit.

Advantageous Effects of the Invention

The present invention is capable of reducing the system construction cost, while increasing the amount of power generation.

Other features and advantages of the present invention will be more apparent from detailed description given below with reference to the accompanying drawings.

MODE FOR CARRYING OUT THE INVENTION

Preferred embodiments of the present invention are described below with reference to the drawings.

Figure 1:
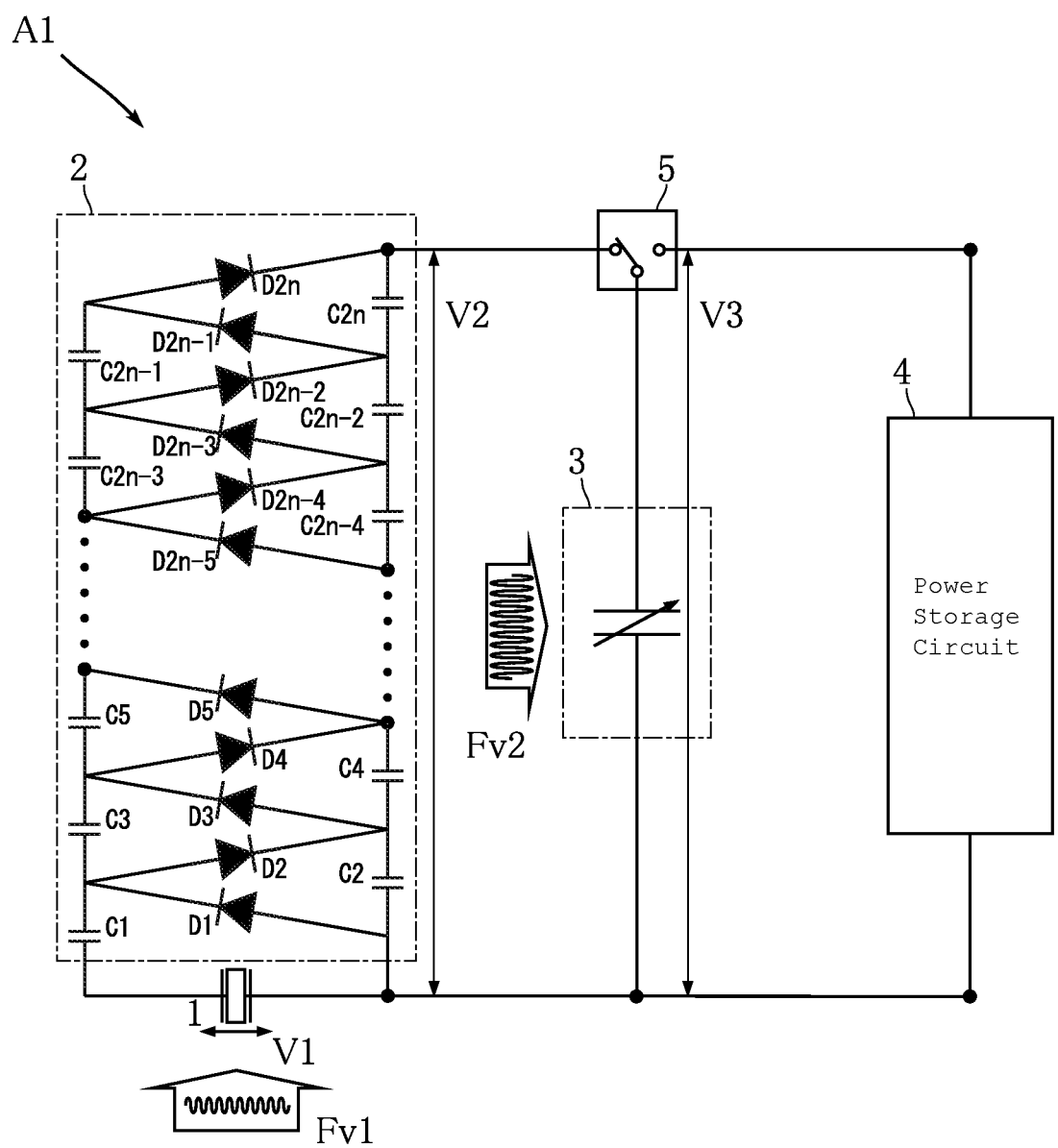
FIG. 1 is a view showing a configuration of an dielectric elastomer power generation system according to the present invention.

FIG. 1 shows a configuration of an dielectric elastomer power generation system according to the present invention. A dielectric elastomer power generation system A1 according to the present embodiment includes a piezoelectric element 1, a multi-stage voltage multiplier/rectifier circuit 2, a dielectric elastomer power generation element 3, a power storage circuit 4 and a switching unit 5. The dielectric elastomer power generation system A1 generates power by using vibration inputs Fv1 and Fv2.

The piezoelectric element 1 is a piezoelectric power generator. The piezoelectric element 1 converts a vibration input into electric power. The piezoelectric element 1 features the ability to generate alternating current (AC) power from vibrations having a relatively small amplitude.

The multi-stage voltage multiplier/rectifier circuit 2 boosts and rectifies an input voltage through multiple stages to output a direct current (DC) voltage approximately equal to an integral multiple of the input voltage. In this embodiment, the multi-stage voltage multiplier/rectifier circuit 2 includes a Cockcroft-Walton circuit. The Cockcroft-Walton circuit is composed of a plurality of diodes and a plurality of capacitors connected in multiple stages for increasing an input voltage to a voltage equal to some multiple of the input voltage. The multi-stage voltage multiplier/rectifier circuit 2 in the example shown in the figures is a Cockcroft-Walton circuit composed of the number 2n of diodes D1, D2 ... D2n and the number 2n of capacitors C1, C2 ... C2n that are connected in n stages. The multi-stage voltage multiplier/rectifier circuit 2 produces a DC voltage output equal to n times the peak-to-peak value of the input AC voltage, which is the difference between the maximum voltage (positive peak) and the minimum voltage (negative peak) of the input AC voltage.

Figure 2:
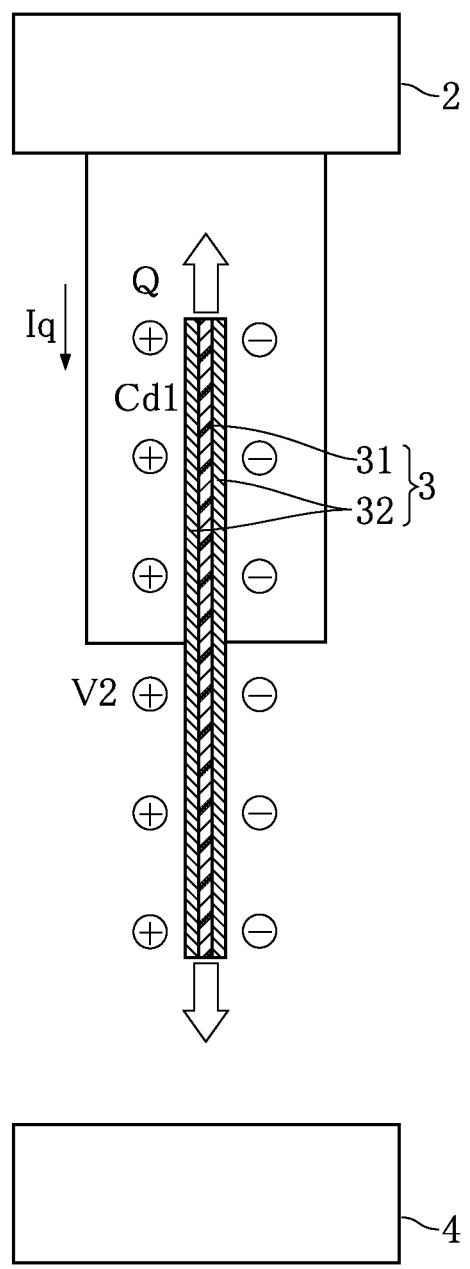
FIG. 2 is a schematic diagram illustrating the principle of power generation by a dielectric elastomer power generation element of the dielectric elastomer power generation system of FIG. 1.
Figure 3:
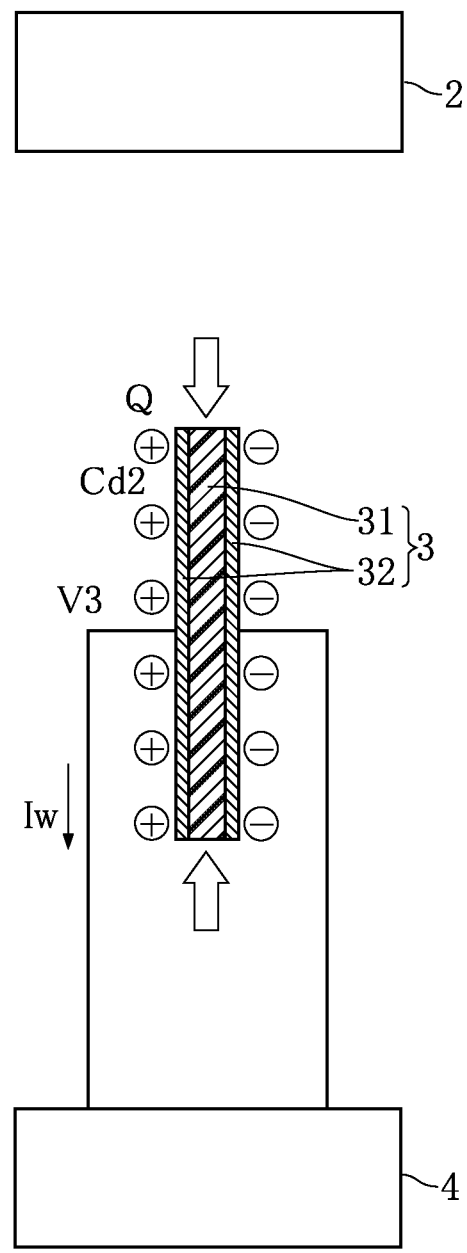
FIG. 3 is a schematic diagram illustrating the principle of power generation by the dielectric elastomer power generation element of the dielectric elastomer power generation system of FIG. 1.

The dielectric elastomer power generation element 3 includes a dielectric elastomer layer 31 and a pair of electrode layers 32 as shown in FIGS. 2 and 3. In addition to the dielectric elastomer power generation element 3, the dielectric elastomer power generation system may include a structural element for transferring external force to the dielectric elastomer power generation element 3, and a mechanism for applying tensile force to the dielectric elastomer power generation element 3 (neither is not illustrated).

The dielectric elastomer layer 31 is required to have elastic deformability and high dielectric strength. Appropriate materials for the dielectric elastomer layer 31 include, but not limited to, silicone elastomers and acrylic elastomers.

The pair of electrode layers 32 sandwiching the dielectric elastomer layer 31 are components at which the initial charges are applied and the output voltage is produced. The electrode layers 32 are made of a material that is electrically conductive and also elastically deformable to comply with elastic deformation of the dielectric elastomer layer 31. Examples of such a material include an elastically deformable material containing fillers to impart electrical conductivity to the material. Carbon nanotubes may be a preferable example of the fillers.

When no external force or constraint is applied to the dielectric elastomer power generation element 3 and no voltage is applied to the pair of electrode layers 32, the dielectric elastomer power generation element 3 is in a relaxed state having a natural length. When an external force is applied, the dielectric elastomer layer 31 will deform elastically.

The power storage circuit 4 receives electric power generated by the dielectric elastomer power generation element 3 and serves as a power storage means of the dielectric elastomer power generation system A1. The power storage circuit 4 is not specifically limited in configuration as long as it has a sufficient capacity for storing electric power generated by the dielectric elastomer power generation element 3. The power storage circuit 4 may be constituted by a secondary battery, such as a nickel metal hydride battery or a lithium-ion battery. The power storage circuit 4 may also be provided with a step-down circuit that lowers the input voltage to a suitable voltage for the secondary battery.

The switching unit 5 switches the electrical connection between the dielectric elastomer power generation element 3, the multi-stage voltage multiplier/rectifier circuit 2 and the power storage circuit 4. The switching unit 5 is not specifically limited in configuration and may include a semiconductor switching element or a switching module that mechanically switches the electrical connection. To enable the dielectric elastomer power generation system A1 to operate as described below, the switching unit 5 may additionally include a detecting means for detecting at least one of, possibly all of the vibration state of the piezoelectric element 1, the state of voltage application to the multi-stage voltage multiplier/rectifier circuit 2, and the stretched or contracted state of the dielectric elastomer power generation element 3. The switching unit 5 may further include a control unit for determining whether to switch the electrical connection based on the result of detection by the detection means.

Next, examples of operations of the dielectric elastomer power generation system A1 will be described.

As shown in FIG. 1, a vibration input Fv1 is supplied to the piezoelectric element 1. The vibration input Fv1 may be vibrations caused by natural energy, for example. The vibration input Fv1 of relatively small amplitude is sufficient for the piezoelectric element 1 to generate power. Therefore, vibrations having amplitude too small for the dielectric elastomer power generation element 3 to generate power may be used as the vibration input Fv1. Also, vibrations having time-varying amplitude may be used as the vibration input Fv1 during the time the amplitude is too small for power generation by the dielectric elastomer power generation element 3.

Power generated by the piezoelectric element 1 is supplied to the multi-stage voltage multiplier/rectifier circuit 2. The power generated by the piezoelectric element 1 from the vibration input Fv1 is AC power having a peak voltage V1. Each time the AC power supplied to the multi-stage voltage multiplier/rectifier circuit 2 switches between positive and negative voltages, the voltage accumulated on the number 2n of capacitors C1, C2 . . . C2n becomes higher. For example, when the application of AC voltage generated by the piezoelectric element 1 from the vibration input Fv1 is sufficiently conducted, the DC voltage V2 output from the multi-stage voltage multiplier/rectifier circuit 2 will be equal to 2n times the input voltage V.

Next, as shown in FIG. 1, a vibration input Fv2 is supplied to the dielectric elastomer power generation element 3. In the figure, the switching unit 5 is operated to connect the multi-stage voltage multiplier/rectifier circuit 2 to the dielectric elastomer power generation element 3. As the vibration input Fv2, vibrations having amplitude sufficient for the dielectric elastomer power generation element 3 to generate power may be used. Also, vibrations having time-varying amplitude may be used as the vibration input Fv2 during the time the amplitude is sufficiently large for power generation by the dielectric elastomer power generation element 3. That is, the vibration input Fv1 and the vibration input Fv2 may be obtained from a single source of vibrations whose amplitude changes with time.

In FIG. 2, the vibration input Fv1 induces an external force acting to pull the dielectric elastomer power generation element 3 in the vertical directions as seen in the figure. As a result, the dielectric elastomer layer 31 of the dielectric elastomer power generation element 3 is stretched vertically as seen in the figure. The dielectric elastomer layer 31 in this state has an increased area and a reduced thickness. Each electrode layer 32 also has an increased area as it deforms by following the deformation of the dielectric elastomer layer 31. In this state, the dielectric elastomer power generation element 3 can serve as a capacitor having a relatively large capacitance Cd1. While the dielectric elastomer power generation element 3 is held in this state, the multi-stage voltage multiplier/rectifier circuit 2 applies the DC voltage V2 to the element 3 as an initial voltage. Upon application of the DC voltage V2 to the dielectric elastomer power generation element 3 with a capacitance of Cd1, the electric current Iq flows and the charge Q accumulates.

FIG. 3 shows the state in which the external force applied in FIG. 2 has been reduced or removed, allowing the dielectric elastomer power generation element 3 to contract. In the figure, the switching unit 5 is operated to connect the power storage circuit 4 to the dielectric elastomer power generation element 3. The dielectric elastomer layer 31 in this state has a reduced area and an increased thickness. Each electrode layer 32 also has a reduced area as it deforms by following the deformation of the dielectric elastomer layer 31. In this state, the dielectric elastomer power generation element 3 serves as a capacitor having a capacitance Cd2 that is smaller than the capacitance Cd1 noted above. Nevertheless, the charge Q accumulated on the pair of electrode layers 32 remains constant. Thus, the ratio of the voltage V3 to the DC voltage V2 is inversely proportional to the ratio of the capacitance Cd2 to the capacitance Cd1. The charge accumulated on the pair of electrode layers 32 is received as the output current Iw by the power storage circuit 4. In this way, when the dielectric elastomer layer 31 is in the contracted state, the output power obtained is greater than the power required to apply the initial voltage. The output voltage is stored on the power storage circuit 4. The sequence of operations described above is repeated to store the electric power generated by the dielectric elastomer power generation element 3 in the power storage circuit 4.

Next, advantages of the dielectric elastomer power generation system A1 will be described.

According to the present embodiment, the electric power needed for applying an initial voltage to the dielectric elastomer power generation element 3 is generated by the piezoelectric element 1. Thus, there is no need to provide a dedicated power source or circuit for the application of an initial voltage to the dielectric elastomer power generation element 3. In addition, AC voltage produced by the piezoelectric element 1 is boosted and rectified by the multi-stage voltage multiplier/rectifier circuit before it is applied as an initial voltage to the dielectric elastomer power generation element. To increase the amount of power generated by the dielectric elastomer power generation element 3, a higher initial voltage is preferred, provided that the initial voltage is within a range for the dielectric elastomer power generation element 3 to operate in the power generation mode. That is, the present embodiment is effective to reduce the cost of constructing the dielectric elastomer power generation system and increase the amount of power generation.

In addition, the multi-stage voltage multiplier/rectifier circuit 2 includes a Cockcroft-Walton circuit, whereby the multi-stage voltage multiplier/rectifier circuit 2 can be constituted by a plurality of diodes and a plurality of capacitors. In addition, the value of the voltage to be applied at each stage is equal to the peak-to-peak value of the input AC voltage. Consequently, the diodes and capacitors are not required to have an extremely high dielectric strength. In addition, the multi-stage voltage multiplier/rectifier circuit 2 doubles as booster and rectifier, which contributes to reducing the number of components otherwise required for the dielectric elastomer power generation system A1. The multi-stage voltage multiplier/rectifier circuit 2 can therefore be constructed at a lower cost. In addition, the mean time between failures can be extended, enabling the dielectric elastomer power generation system A1 to be more reliable.

The dielectric elastomer power generation system according to the present invention is not limited to the specific embodiments described above. The specific configuration of each part of the dielectric elastomer power generation system according to the present invention may be varied in design in many ways.

The invention claimed is:

1. A dielectric elastomer power generation system comprising:
   a dielectric elastomer power generation element including a dielectric elastomer layer and a pair of electrodes sandwiching the dielectric elastomer layer;
   a piezoelectric element;
   a multi-stage voltage multiplier/rectifier circuit that boosts and rectifies a voltage generated by the piezoelectric element and applies a resulting voltage to the dielectric elastomer power generation element as initial charge;
   a power storage circuit that receives electric power generated by the dielectric elastomer power generation element, and
   a switching unit that can perform control of an electrical connection between the dielectric elastomer power generation element and the multi-stage voltage multiplier/rectifier circuit, and an electrical connection between the dielectric elastomer power generation element and the power storage circuit based on a vibration state of the piezoelectric element or a stretched or contracted state of the dielectric elastomer power generation element.

2. The dielectric elastomer power generation system according to claim 1, wherein the multi-stage voltage multiplier/rectifier circuit comprises a Cockcroft-Walton circuit.

* * * * *

UNITED STATES PATENT AND TRADEMARK OFFICE
CERTIFICATE OF CORRECTION

| | |
|---|---|
| PATENT NO. | : 11,909,337 B2 |
| APPLICATION NO. | : 17/264845 |
| DATED | : February 20, 2024 |
| INVENTOR(S) | : Seiki Chiba et al. |

It is certified that error appears in the above-identified patent and that said Letters Patent is hereby corrected as shown below:

On the Title Page

In item (73) (Assignees):
Line 1, please delete "Selki Chiba, Tokyo (JP)" and insert --Seiki Chiba, Tokyo (JP)--.

Signed and Sealed this
Seventh Day of May, 2024

Katherine Kelly Vidal
*Director of the United States Patent and Trademark Office*